United States Patent [19]

Qian et al.

[11] Patent Number: 5,571,576
[45] Date of Patent: Nov. 5, 1996

[54] METHOD OF FORMING A FLUORINATED SILICON OXIDE LAYER USING PLASMA CHEMICAL VAPOR DEPOSITION

[75] Inventors: Lingqian Qian; Melvin C. Schmidt, both of San Jose; Glenn L. Nobinger, Santa Clara, all of Calif.

[73] Assignee: Watkins-Johnson, Palo Alto, Calif.

[21] Appl. No.: 386,647

[22] Filed: Feb. 10, 1995

[51] Int. Cl.$^6$ .................................................. H05N 1/02
[52] U.S. Cl. .................... 427/574; 204/192.37; 427/99; 427/126.1; 427/578; 427/579; 437/228; 437/238
[58] Field of Search .................................. 427/99, 126.1, 427/574, 578, 579; 204/192.37; 437/228, 238

[56] References Cited

U.S. PATENT DOCUMENTS

| | | | |
|---|---|---|---|
| 4,668,365 | 5/1987 | Foster et al. | 204/192.23 |
| 4,960,071 | 10/1990 | Akahori et al. | 118/722 |
| 4,987,102 | 1/1991 | Nguyen et al. | 437/238 |
| 5,057,455 | 10/1991 | Foo et al. | 437/193 |
| 5,124,014 | 6/1992 | Foo et al. | 204/192.32 |
| 5,215,787 | 6/1993 | Homma | 427/248.1 |
| 5,240,554 | 8/1993 | Hori et al. | 156/643 |
| 5,288,518 | 2/1994 | Homma | 427/255.1 |
| 5,296,404 | 3/1994 | Akahori et al. | 437/173 |
| 5,334,552 | 8/1994 | Homma | 427/238 |

OTHER PUBLICATIONS

Journal of Electrochemical Society, vol. 140 No. 3, Mar. 1993—A Room Temperature Chemical Vapor Depostion SiOF Film Formation Technology for the Interplayer in Submicron Multilevel Interconnections—Homma, Yamaguch, Murao.

1993 International conference on Solid State Device and Materials, Makuhari, 1993, pp. 158–160—Preparation of SiOF Films With Low Dielectric Constant by ECR Plasma Chemical Vapor Deposition—Fukada and Akahori (no month avail.).

Journal of Non–Crystaline Solids 100 (1988) pp. 269–273, North–Holland, Amsterdam—Fabrication of Flourine–Doped Silica Glasses by the Sol–Gel Method—Shibata, Kitagawa & Horiguchi (no month avail.).

Journal of Electrochemical Society, vol. 140, No. 7, Jul. 1993—A Spin–On–Glass Film Treatment Technology Using a Fluoroalkoxysilane Vapor at Room Temperature—Homma & Murao.

1993 Dry Process Symposium, Tokyo—High–Quality and Low Dielectric Constant $SiO_2$ CVD Using High Density Plasma—Hayasaka, Nishiyama, Miyajima, Tomioka, Nakata & Okano (no month avail).

Pp. 71—77—A New Interlayer Dielectric Film Formation Technology Using Room Temperature Flow CVD—Homma & Murao, undated.

17th Internation Conference on Metallurgical Coatings and 8th International Conference on Thin Films, San Diego, CA, USA, Apr. 2–6, 1990, pp. 269–278—Low Temperature $SiO_2$ Films—Falcony, Ortiz, Lopez, Alonso & Muhl (no month avail.).

Vacuum/vol. 43/No. 8/pp. 843 to 847/1992, Pergamon Press Ltd.—Low Temperature $SiO_2$ Films Deposited by Plasma Enhanced Techniques—Alonso & Ortiz (no month avail.).

J. Appl. Phys. 57 (2) 15 Jan. 1985, 1985 American Institute of Physics—Electrical Properties of Silicon Nitride Films Plasma–Deposited From $SiF_4$,, $N_2$, and $H_2$ Source Gases—Fujita, Ohishi Toyoshima, & Sasaki.

(List continued on next page.)

Primary Examiner—Bernard Pianalto
Attorney, Agent, or Firm—Flehr, Hohbach, Test, Albritton & Herbert

[57] ABSTRACT

A method of forming a fluorinated silicon oxide dielectric layer by plasma chemical vapor deposition. The method includes the steps of creating a plasma in a plasma chamber and introducing a silicon-containing gas, a fluorine-containing gas, oxygen and an inert gas such that the gases are excited by the plasma and react proximate a substrate to form a fluorinated silicon oxide layer on the surface of the substrate. The fluorinated layer formed has a dielectric constant which is less than that of a silicon oxide layer.

19 Claims, 5 Drawing Sheets

OTHER PUBLICATIONS

D. F. Peppard, W. G. Brown and W. C. Johnson (Contribution from the George Herbert Jones Laboratory, The University of Chicago) vol. 68, pp. 76–77. Aug. 6, 1945—Alkyl Fluorosilicates, by Peppard, Brown, & Johnson.

D. F. Peppard, W. G. Brown and W. C. Johnson (Contribution from the George Herbart Jones Laboratory, The University of Chicago) vol. 68, Aug. 31, 1945, pp, 77–79—Transesterification Reactions of Alkyl Silicates—Peppard, Brown, and Johnson.

Jun. 9–10, 1992 VMIC Conference, pp. 65–71—A New SOG Film Formation Technology Using A Room Temperature Fluoro–Alkoxy–Silane Treatment (FAST)—Homma & Murao.

Mat. Res. Soc. Symp. Proc. vol. 165, 1990 Materials Research Society, pp. 107–113—Directional Deposition of Silicon Oxide by a Plasma Enhanced TEOS Process—Hsieh, Ibbotson, Mucha & Flamm. (no month avail.).

Mat. Res. Soc. Symp. Proc. vol. 73, 1986 Materials Research Society, pp. 251–259—Fluorine in Silica Gels—Rabinovich & Wood (no month avail. ).

Recd. 19 Aug. 1980, accepted for publication 26 Jan. 1981—The Reaction of Fluorine Atoms with Silicon—Flamm, Donnelly, & Mucha.

Jun. 7–8, 1994 VMIC Conference, pp. 15–21—Fully Intergrated Back End of the Line Interconnect Process for High Performance ULSIs—Anand, Matsuno, Murota, Shibata & Kakumu.

1988 American Institute of Physics, J. Appl. Phys. 64 (7), 1 Oct. 1988, pp. 3481–3486—Bonding Configuration of Fluorine in Fluorinated Silicon Nitride Films—Fujita, Toyoshima, & Sasaki (no month avail.).

Thin Solid Films, 109 (1983) pp. 47–57, Preparation and Characterization—The Analyses of an $SiF_4$ Plasma in an R.F. Glow Discharge for Preparing Fluorinated Amorphous Silicon Thin Films—Mutsukura, Ohuchi, Satoh & Machi (no month avail.).

Plasma Deposition and Characterization of Fluorinated Silicon Nitride Films—Nguyen, Dobuzinsky, Gleason, & Gibson, undated.

1994 Symposium on VLSI Technology Digest of Technical Papers, pp. 59–60—Reduction of Wiring Capacitance with New Low Dielectric SiOF Interlayer Film for High Speed/Low Power Sub–Half Micron CMOS—Ida, Yoshimaru, Usami, Ohtomo, Shimokawa, Kita & Ino (no month avail.).

1994 Symposium on VLSI Technology Digest of Technical Papers, pp. 73–74—A Planarized Multilevel Interconnect Scheme with Embedded Low–Dielectric–Constant Polymers for Sub–Quarter–Micron Applications—Jeng, Chang, Kroger, McAnally, Havemann (no month avail.).

1993 Dry Process Symposium, Tokyo, pp. 163–168—High–Quality and Low Dielectric Constant $SiO_2$ CVD Using High Density Plasma—Hayasaka, Nishiyama, Miyajima, Tomioka, Nakata & Okano (no month avail.).

Interlayer Dielectric for Multilevel Interconnection—Hayasaka, Nishiyama, Miyajima, Tomioka, Nakata & Okano, undated.

Jpn. J. Appl. vol. 33 (1994) Pt. 1, No. 1B, Nov. 20, 1993, pp.408–412—Low Dielectric Constant Interlayer Using Fluorine–Doped Silicon Oxide—Usami, Shimokawa & Yoshimaru (no month avail.).

Executed Abstracts of 1993 International Conference on Solid State Devices and Materials, 1993, pp. 161–163—Low Dielectric Constant Interlayer Using Fluorine Doped Silicon Oxide—Usami, Shimokawa, Yoshimaru (no month avail.).

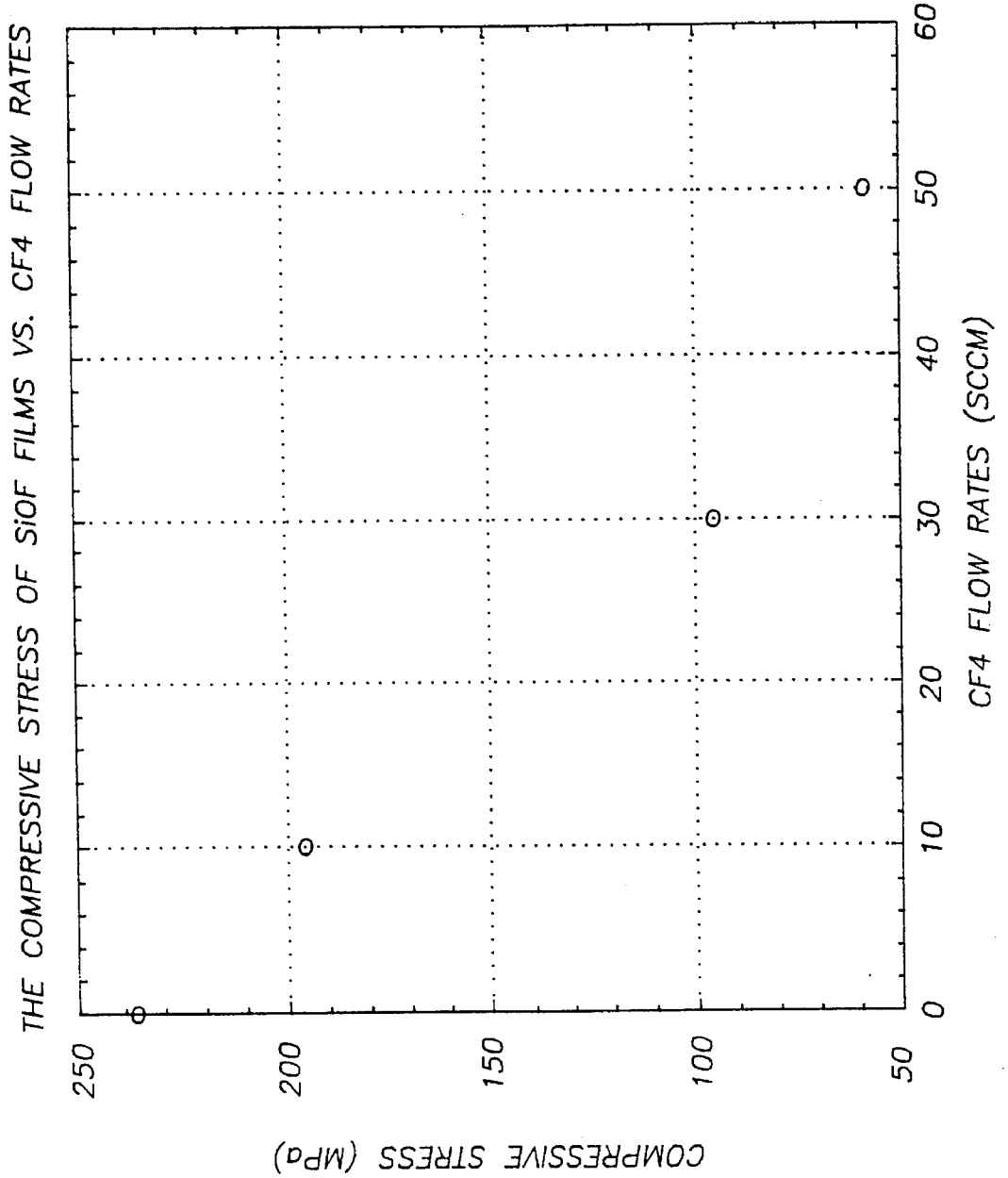

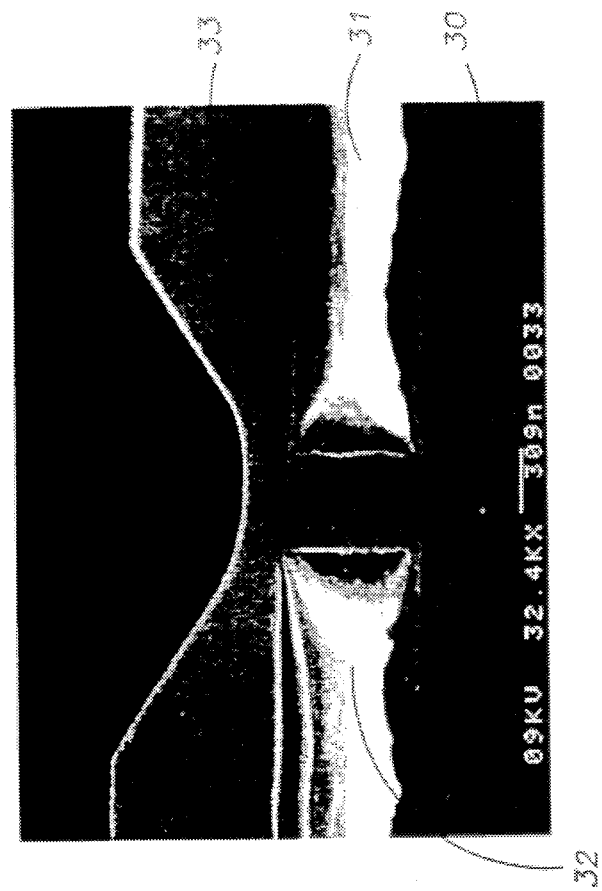
FIG.—5a
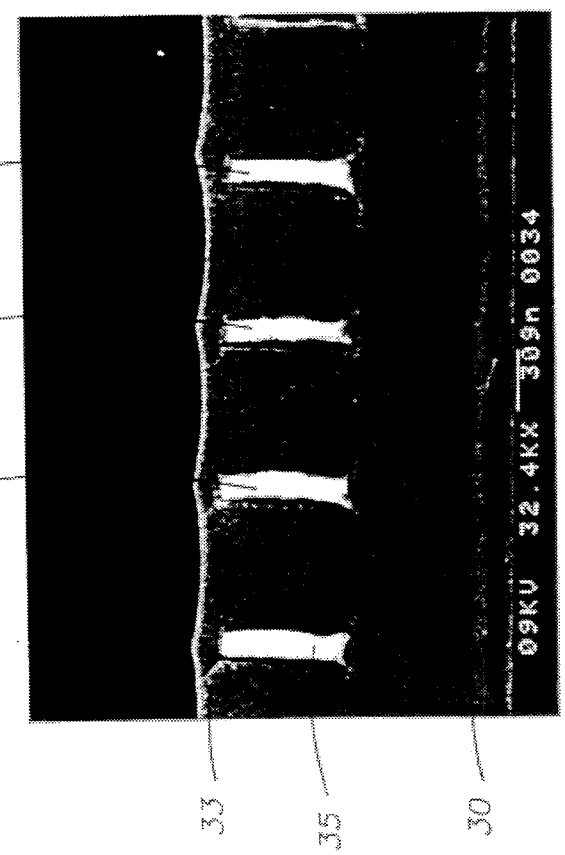
FIG.—5b

METHOD OF FORMING A FLUORINATED SILICON OXIDE LAYER USING PLASMA CHEMICAL VAPOR DEPOSITION

BRIEF DESCRIPTION OF THE INVENTION

This invention relates generally to the formation of a dielectric layer on the surface of a substrate or wafer, and more particularly to a method for depositing a fluorinated silicon oxide dielectric layer on the surface of a substrate or wafer.

BACKGROUND OF THE INVENTION

A dielectric layer is an important component in the manufacture of integrated circuits. A dielectric is used generally to electrically isolate conductive layers and enable useful interconnects between such layers. As device densities increase, multiple dielectric layers may be used to isolate stacked device features. When forming such multilayer dielectric it is desirable to provide a dielectric film with good gap fill, isolation, stress and step coverage properties on patterned material layers. These properties become critical as device dimensions shrink.

Dielectric layers are often formed by Chemical Vapor Deposition (CVD). The CVD process deposits a material on a surface by transport and reaction of certain gaseous precursors on such surface. Plasma may be used to assist decomposition of certain gaseous chemicals. CVD apparatus come in many forms. Low pressure CVD systems and atmospheric pressure CVD systems operate on thermal CVD principles. Plasma CVD systems operate by disassociation and ionization of gaseous chemicals and are able to operate at lower temperatures than conventional thermal CVD systems. Such lower temperature methods are desirable and will minimize diffusion of shallow junctions and interdiffusion of metals.

In addition to good gap fill and step overage properties it is desirable to provide a dielectric layer with a low dielectric constant. As the intra-layer metal width and spacing of the interconnections decrease, the wiring (or sometimes referred to as line-to-line) capacitance increases and becomes the major factor contributing to the total capacitance. Another factor contributing to the total capacitance, but to a lesser extent, is the inter-layer capacitance. The total capacitance, limits the operating speed of such devices. A layer with a low dielectric constant provides an immediate performance improvement due to a reduction in capacitance.

It is desirable to develop a suitable method of forming a dielectric which provides low dielectric constants, having all of the necessary film properties such as stability, density, gap fill, low film stress and step coverage.

OBJECTS AND SUMMARY OF THE INVENTION

It is an object of this invention to provide an improved method for formation of dielectric layers.

More particularly, it is an object of this invention to provide an improved method for formation of a fluorinated silicon oxide dielectric layer.

A further object of this invention is to provide a method for formation of a fluorinated silicon oxide layer with an improved dielectric constant.

A still further object of the invention is to provide a method for formation of a fluorinated silicon oxide dielectric layer which has desirable gap fill on patterned materials, low film stress and step coverage properties.

These and other objects are achieved by the method herein disclosed comprising the steps of forming a fluorinated silicon oxide dielectric layer on a substrate using a plasma chemical vapor deposition apparatus which includes a process chamber and a plasma chamber, wherein a substrate is positioned within the process chamber. An inert gas such as argon, and oxygen gas are introduced into the plasma chamber. Radio frequency (r.f.) power is introduced into the plasma chamber such that a plasma is created in the plasma chamber. A silicon-containing gas is introduced into the process chamber adjacent to the surface of the substrate. A fluorine-containing gas is introduced into either the plasma chamber or the process chamber such that the fluorine gas is available at the surface of the substrate. The silicon-containing gas and the fluorine-containing gas are excited by the plasma and interact to form a layer of fluorinated silicon oxide on the surface of the substrate.

BRIEF DESCRIPTION OF THE DRAWINGS

Other objects and advantages of the invention become apparent upon reading of the detailed description of the invention provided below and upon reference to the drawings in which:

FIG. 4 is a graph comparing the compressive stress of the SiOF film deposited according to the method of this invention and the flow rate of the fluorine-containing gas.

FIGS. 5a and 5b are photographs made by Scanning Electron Microscope (SEM) of a cross-section of a fluorinated silicon oxide layer showing the gap fill and step coverage achieved according to the method of the invention.

DESCRIPTION OF THE PREFERRED EMBODIMENT

Figure 1:
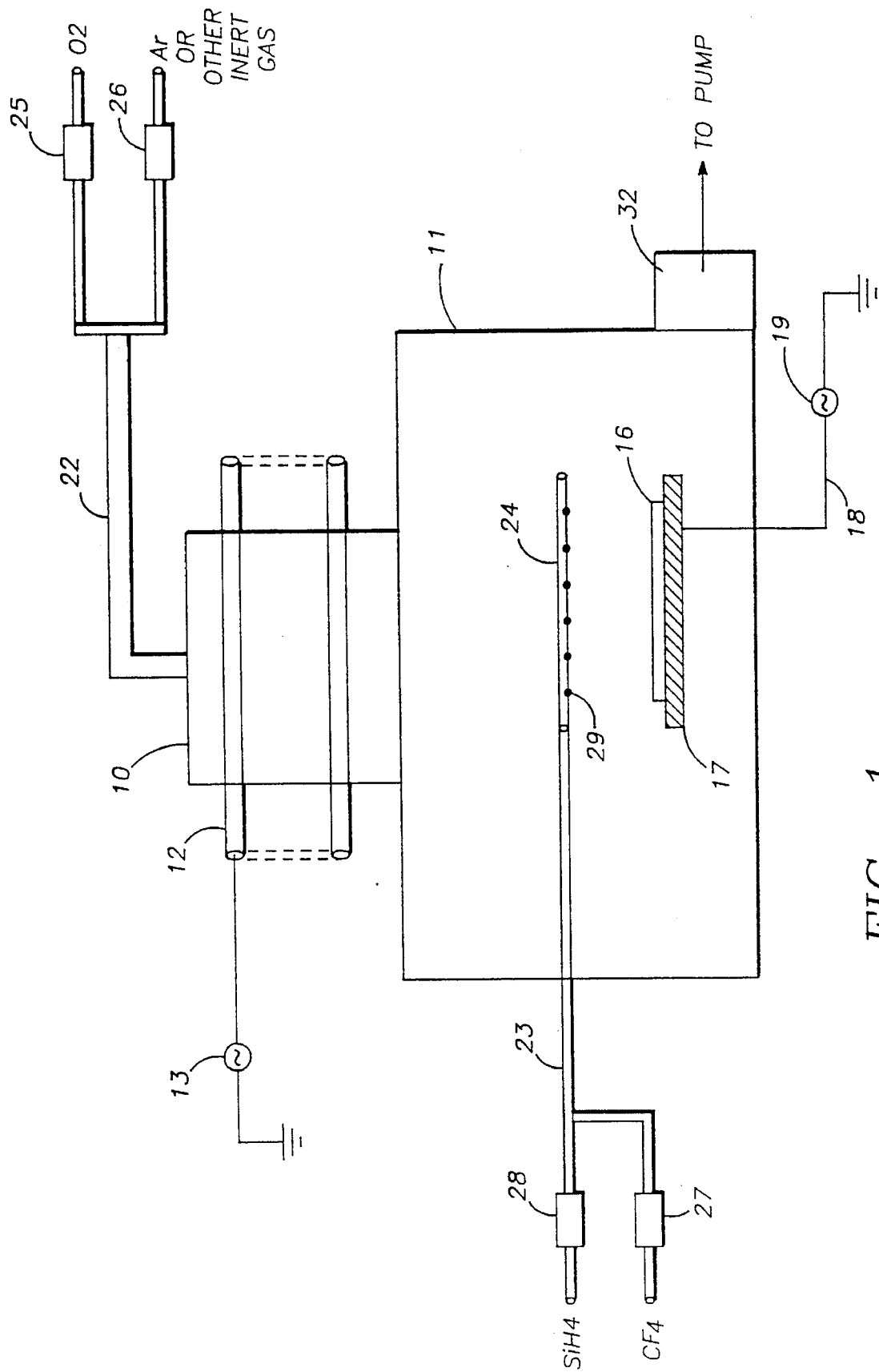
FIG. 1 is a cross-sectional view of an apparatus used for formation of a fluorinated silicon oxide layer (SiOF) according to one embodiment of the invention.
Figure 2:
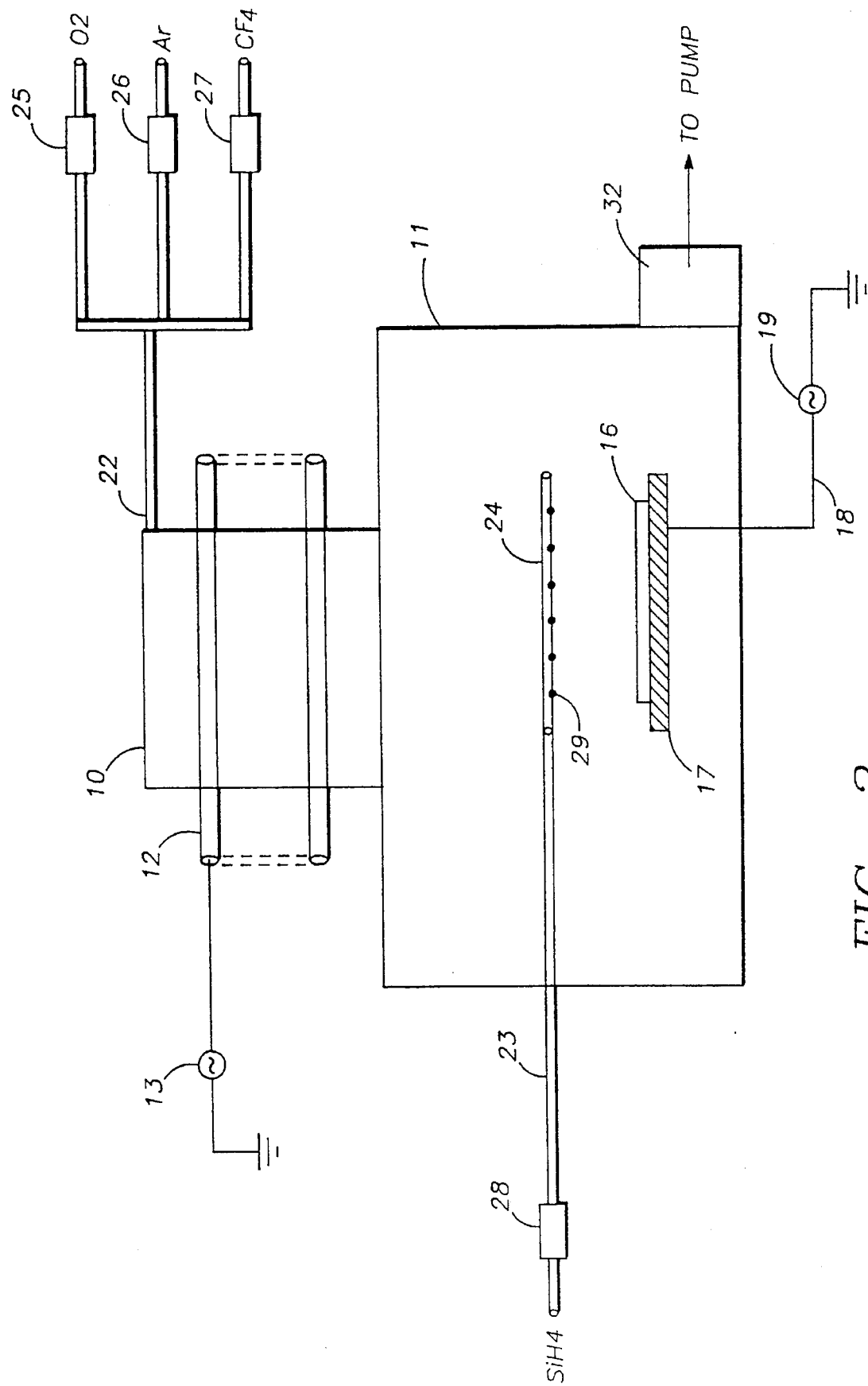
FIG. 2 is a cross-sectional view of an apparatus used for formation of a fluorinated silicon oxide layer according to an alternative embodiment of the invention.

Turning to the drawings, wherein like components are designated by like reference numerals, FIGS. 1 and 2 represent apparatus that can be used to form a fluorinated silicon oxide dielectric layer in accordance with the method of this invention. The apparatus includes a plasma chamber 10 and a process chamber 11. The chambers 11 and 10 are evacuated through port 32 to a vacuum in the range of 0 to 20 mTorr. Coils 12 are arranged around the plasma chamber 10 to excite gases into a plasma state. Various arrangements of coils known in the art may be used to generate the plasma. A substrate 16 is placed on a support 17 (sometimes referred to as a chuck) positioned within process chamber 11, such that a surface of the substrate is facing upwards. The support 17 may be biased by application of r.f. bias power through r.f. generator 19 and transmission line 18. A mechanical support or an electrostatic support, known in the art may be used.

In FIG. 1, the preferred embodiment of the invention, a first gas stream is introduced into the plasma chamber 10 proximate to coils 12 through gas inlet line 22. Preferably, the first gas stream includes a mixture of oxygen and argon gases which are introduced to inlet line 22. The desired flow rates of the oxygen and argon are controlled by mass flow controllers 25 and 26, respectively. The invention may also be carried out with inert gases other than argon. The inert gas provides a sputter etch component for simultaneous etching of the fluorinated silicon oxide layer during its deposition when the support 17 is biased. Other inert gases that may be used are, any one of: argon, neon, xenon and krypton, or any mixture thereof. Helium may also be used in combination with any one of argon, neon, xenon and krypton, or in combination with any mixture of argon, neon, xenon and krypton.

To generate a plasma, r.f. energy 13 is directed into plasma chamber 10 through coils 12 arranged around plasma chamber 10. It is preferred that the frequency of the r.f. energy be 13.56 MHz, which is a commercial standard frequency. In such a configuration, a plasma is generated in the chamber 10 whereby a large percentage of the gaseous molecules introduced by said first gas stream are dissociated to form reactive species, including ionized atoms. An ion density of greater than $10^{11}$ ions/cm$^3$ is achieved, and is referred to as a high density plasma. The plasma contains electrons with very high energy compared to the other species present. The high electron energy increases the density of disassociated reactant species available for deposition.

A second gas stream which includes a silicon-containing gas and a fluorine-containing gas is introduced into the process chamber 11 through gas inlet line 23. The silicon-containing gas and the fluorine-containing gas are introduced at a desired flow rate by way of mass flow controllers 28 and 27. Preferably the gases are SiH$_4$ and CF$_4$, respectively. The gases mix in gas inlet line 23 as they enter the process chamber 11. A gas distribution ring 24 is placed inside the process chamber 11 adjacent to substrate 16 to receive and disperse the second gas stream. The gas distribution ring 24 contains a plurality of distribution holes 29 which are placed equally around said ring 24. The second gas is distributed substantially uniformly adjacent the surface of the substrate 16 through the plurality of distribution holes 29. As the silicon- and fluorine-containing gases exit the gas ring 24, they are disassociated and activated by the plasma which has entered the process chamber 11 from the plasma chamber 10. In this disassociated and activated state, the silicon and fluorine gaseous chemicals react to form a layer of fluorinated silicon oxide on the surface of the substrate 16. The plasma has excited the silicon and fluorine gases, and this allows the CVD reaction to occur at lower temperatures than conventional thermal CVD processes. In the method of the invention, the temperature of the substrate is in the range of substantially 100° C. to 400° C. This low temperature range is desirable because it is well below the melting point of any metallic interconnects or components, and is below deformation modes of the materials used and thus prevents defects such as stress induced voids, expansion mismatch and hillock formation.

The silicon source and the fluorine source gases are introduced into the chambers 11 and 12 at approximately the same flow rate. The flow rate of the inert gas may vary from approximately the same as the silicon and fluorine gases, up to at least approximately twice that of the silicon and fluorine gases. To produce good quality fluorinated silicon oxide, oxygen gas is introduced at a flow rate of least approximately twice that of the silicon and fluorine gases. The actual flow rates of the gases are dependent upon the vacuum system, the gas ring design and other equipment configurations, however the flow rate ratio will continue to apply.

In an alternative embodiment of the invention, depicted in FIG. 2, the fluorine-containing gas is introduced into plasma chamber 10 as a constituent of the first gas stream via gas inlet line 22. Thus, in this embodiment, the first gas stream contains a mixture of oxygen, argon and a fluorine-containing gas. The desired flow rates of the oxygen, argon and fluorine gas are controlled by mass flow controllers 25, 26 and 27, respectively. A second gas stream comprises a silicon-containing gas which is conveyed into the process chamber 11 via gas inlet line 23. The silicon-containing gas is conveyed to gas distribution ring 24 and is distributed substantially uniformly adjacent the surface of said substrate 16 through a plurality of distribution holes 29. In this embodiment, the silicon and fluorine source gases do not mix inside the gas inlet line 23 or the distribution ring 24. Instead, the fluorine source is contained in the plasma, with a portion of the fluorine source in a disassociated and ionized state, and enters the process chamber 11 from the plasma chamber 10 whereby it interacts with the silicon gas as the silicon gas exits the distribution holes 29 proximate the substrate 16 to form a layer of fluorinated silicon oxide on the surface of the substrate 16.

In the preferred embodiment, the fluorine-containing gas will be comprised of a fluorocarbon represented by the general formula $C_nF_{2+2n}$, where n is an integer of 1 to 3, and in particular the fluorine source will be tetrafluoromethane (chemical formula: CF$_4$). Preferably, the silicon-containing gas will be silane (chemical formula: SiH$_4$), and the inert gas will be argon (chemical formula Ar). In this embodiment of the invention, the chemical reaction is represented by:

Ar + unreacted and reacted precursors + reaction by-products

The invention can also be carried out with an alternate chemistry where the fluorine-containing gas is comprised of silicon tetrafluorine (chemical formula: SiF$_4$); represented by the chemical reaction:

Ar + unreacted and reacted precursors + reaction by-products

As discussed above, it is desirable to reduce the dielectric constant of the layer deposited on the substrate 16. It has been found that a low dielectric constant will be a function of the fluorine concentration in the layer. The fluorine concentration of the layers formed according to the inventive method were determined by Rutherford Back-scattering Spectroscopy (RBS). Two different layers were tested. Both layers were deposited under the following process conditions: SiH$_4$, CF$_4$ and Ar were each introduced at a flow rate of 40 sccm and O$_2$ was introduced at 80 sccm. The pressure in the chambers 11 and 12 was in the range of 4–5 mTorr. An r.f. power of 5 kW was applied to the coils 12 and the support 17 was not biased. One layer had a deposited SiOF thickness of 7600 angstroms with the resulting chemical concentration: 11.9 atomic percent fluorine, 38.8 atomic percent silicon and 49.3 atomic percent oxygen. The other layer had a SiOF deposited thickness of 950 angstroms with a chemical concentration of: 10.2 atomic percent fluorine, 41.4 atomic percent silicon and 48.4 atomic percent oxygen.

Figure 3:
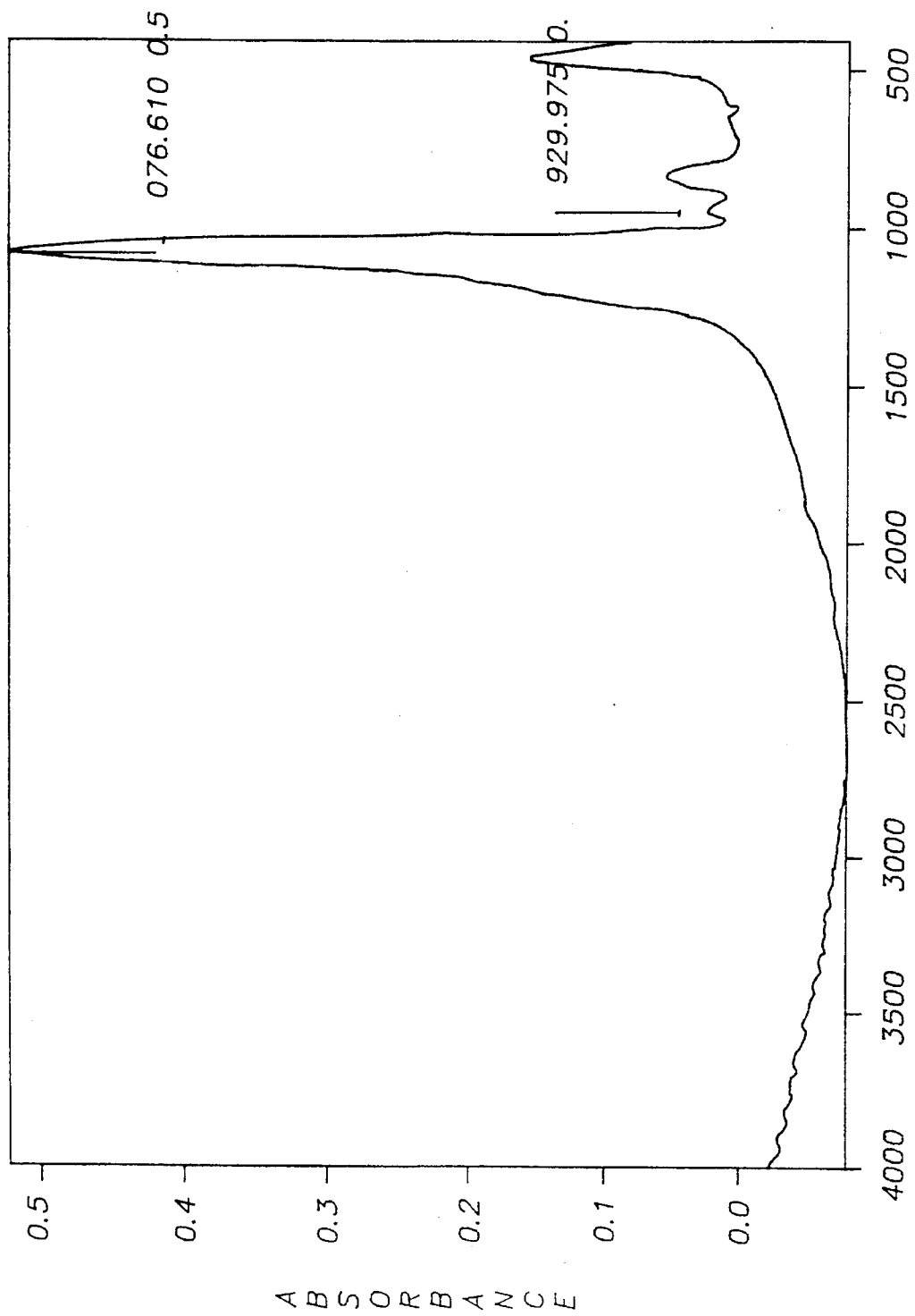
FIG. 3 is a graph depicting a Fourier transform infrared absorption (FTIR) spectrum of a SiOF layer formed according to the invention.

While the thickness of the two SiOF layers differ significantly, the fluorine concentration in the layers is fairly consistent at above 10 atomic percent fluorine. The RBS analysis showed no detectable carbon contamination. Carbon contamination in the two layers was also tested by X-ray Photoelectron Spectroscopy (XPS) and by Secondary Ion Mass Spectroscopy (SIM) analysis. In both tests the carbon contamination was less than 0.02 percent. Another important quality in a dielectric layer is resistance to moisture absorption. FIG. 3 illustrates the fourier transform infrared absorption (FTIR) spectrum for a SiOF layer exposed to air for two days after it was formed in accordance with the method of the invention. The layer was deposited with $SiH_4$, $CF_4$ and Ar each at a flow rate of 40 sccm, and $O_2$ at a flow rate of 80 sccm. The chambers 10 and 11 were evacuated to a pressure of 5 mTorr, and the support 17 was biased with an r.f. power of 600 watts. The absorption peaks depicted in FIG. 3 correspond to Si-O and Si-F, at wave numbers of approximately 1077/cm and 930/cm, respectively. The absorption peak intensity corresponding to the water or the hydroxyl radical which would occur between 3300–3600/cm is not detected, indicating that the water content is near zero.

It is important for a film to exhibit low film stress. FIG. 4 is a graph illustrating the compressive stress of the fluorinated silicon oxide film deposited at various fluorine gas flow rates in accordance with the inventive method. The $CF_4$ gas flow rate was tested in the range of 30 to 50 sccm. The $SiH_4$, Ar and $O_2$ flow rates were held constant at 70 sccm, 100 sccm and 140 sccm, respectively. As shown in FIG. 4, the compressive film stress results were in the range of approximately 100 to 50 MPa, with the film stress decreasing as the $CF_4$ flow rate increased.

It is desirable for a layer to provide good gap fill and step coverage on patterned substrates. To further increase such desirable film properties etching of the substrate during deposition may be employed. Referring again to FIG. 1, the method of the invention provides for etching the substrate whereby an r.f. bias is applied to the support 17 through r.f. generator 19 and transmission line 18. The r.f. bias is applied creating a negative dc bias voltage on the support 17. The negative dc bias will accelerate ions towards the surface of substrate 16.

In the embodiment of the invention when the support 17 is biased, there is a combination of two etchants applied to the surface of the substrate 16. Free active fluorine ions will produce reactive ion etching at the surface of the substrate 16, while the argon ions (or other inert gas ions) will sputter etch the surface of the substrate 16. According to the method of this invention, the etching occurs simultaneously with the deposition of the fluorinated silicon oxide layer. FIGS. 5a and 5b illustrate excellent gap fill and step coverage of a layer produced with biasing of the chuck 17 in accordance with the present inventive method. Such excellent properties are achieved without resort to separate iterative deposition and etch steps. In addition, sputtering with argon ions is found to enhance the density of the deposited film.

EXAMPLE: In an example, a fluorinated silicon oxide layer was deposited in the apparatus of FIG. 1 operated pursuant to the Table set forth below. The temperature of the substrate was maintained below 400° C.

TABLE

| Flow Rates: | $SiH_4$ | 40 sccm |
| --- | --- | --- |
|  | $CF_4$ | 40 sccm |
|  | $O_2$ | 80 sccm |
|  | Ar | 40 sccm |
| r.f. Frequency |  | 13.56 MHz |
| r.f. Bias Power |  | 700 Watts |
| Pressure |  | 4–10 MTorr |

The method was performed in a single step whereby deposition and etching occur simultaneously. A deposition rate of 1300 angstroms/min was observed.

With application of the r.f. bias, the substrate temperature increases. It is important to keep the substrate temperature below the melting point of aluminum. To control the temperature a cooling medium is circulated through the support 17. It has been found that keeping the wafer chuck cool is important to stabilize the fluorine concentration in the deposited film. If the chuck is too hot, substantially above 400° C., the resulting film contains low fluorine concentration.

Film characteristics were tested for the SiOF layer deposited in the Example. The dielectric constant was 3.5, significantly below that of a conventional silicon dioxide film, which is reported in the range of 4.0 to 4.3 This low constant indicates that tightly bound Si-F networks with less residual OH radicals are present in the film. Water optical absorption was below the IR detection limit. After the wafer was exposed to air for ten days the moisture content was 0.575% according to an MEA (moisture evolution analysis) measurement. The refractive index is 1.43 to 1.44. No significant change of the refractive index was observed after annealing of the sample at 900 C. for one half hour in a nitrogen environment, indicating film stability. Impurity levels were below XPS detection limit, and compressive film stress was below 100 MPa. As the results just stated show, the inventive method disclosed herein has produced a film which possesses desirable film properties along with a dielectric constant significantly below a conventional silicon oxide film.

The excellent step coverage and gap fill achieved can be appreciated by reference to FIGS. 5a and 5b, a SEM photograph of portion the cross section of an eight inch wafer with a fluorinated silicon oxide layer 33. In FIG. 5a the wafer contains aluminum lines 31 and 32 formed on the surface of substrate 30. The lines 31 and 32 were spaced apart at 0.35 microns. The aspect ratio of the gap between lines 31 and 32 was 1.5 to 1.0. An SiOF layer 33 was deposited atop the lines 31 and 32 and the substrate 30. The layer 33 was deposited under the following flow rate conditions: $SiH_4$ at 26 sccm, $CH_4$ at 20 sccm, $O_2$ at 100 sccm and Ar at 100 sccm. The support (not shown) was biased with an r.f. bias power of 700 watts, and chamber pressure was at about 5 mTorr. The layer was deposited in a single step. As shown be FIG. 5a, the SiOF layer has uniformly filled the 0.35 micron gap without any voids, hillocks or other defects.

FIG. 5b illustrates a SEM photograph of the cross section of a different area of the same wafer and SiOF layer 33 depicted in FIG. 5a. This portion of the wafer contains aluminum lines 35, 36, 37 and 38 formed on the surface of substrate 30. The lines 35, 36, 37 and 38 were spaced at 0.6 microns, and the aspect ratio of such lines was 1 to 1. Again, excellent step coverage and gap fill is achieved without the formation of voids, hillocks and other defects. The chemistry and method disclosed in this invention can successfully fill 0.35 micron gaps, and has achieved such excellent gap fill at both the center and on the edge of an eight inch substrate.

While the invention has been described in connection with specific embodiments it is evident that many variations, substitutions, alternatives and modifications will be apparent to those skilled in the art in light of the foregoing description. Accordingly, this description is intended to encompass all such variations, substitutions, alternatives and modifications as fall within the spirit of the appended claims.

What is claimed:

1. A method of forming a fluorinated silicon oxide layer on the surface of a substrate using a plasma chemical vapor deposition apparatus which includes a process chamber and a plasma chamber, comprising the steps of:

positioning the substrate within said process chamber;

introducing into said plasma chamber an inert gas and oxygen gas, said inert gas being selected from at least one of the inert gases of the group consisting of argon, neon, krypton or xenon;

introducing r.f. power into said plasma chamber such that a plasma is created in the plasma chamber, and wherein the stability of the plasma is enhanced by introduction of said inert gas;

introducing a silicon-containing gas into said process chamber adjacent the surface of said substrate; and introducing into one of said chambers a fluorine-containing gas whereby said fluorine gas is available at the surface of said substrate, and said silicon-containing gas and said fluorine-containing gas are excited by said plasma and interact proximate to the surface of said substrate to form a fluorinated silicon oxide layer on the surface of said substrate.

2. The method of claim 1 further comprising the step of simultaneously applying an r.f. bias to said substrate during the formation of said fluorinated silicon oxide layer such that the surface of said substrate is sputtered by ions of said inert gas and etched by ions of said fluorine-containing gas to enhance the filling of gaps on the surface of said substrate.

3. The method of claim 1 wherein the flow rate of said oxygen gas is approximately twice the flow rate of each of said silicon and fluorine-containing gases.

4. The method of claim 1 wherein said plasma comprises an ion density of greater than $10^{11}$ ions/cm$^3$.

5. The method of claim 1 wherein said fluorine-containing gas is a fluorocarbon represented by the general formula $C_nF_{2+2n}$, wherein n is an integer of 1 to 3.

6. The method of claim 5 wherein said fluorocarbon is tetrafluoromethane ($CF_4$).

7. The method of claim 1 wherein said silicon-containing gas is silane.

8. The method of claim 1 wherein said fluorine-containing gas is silicon tetrafluorine ($SiF_4$).

9. The method of claim 1 wherein said substrate is maintained at a temperature of not more than 450° C.; and said process chamber is maintained at a pressure of not more than 20 mTorr.

10. A method of forming a fluorinated silicon oxide layer on the surface of a substrate using a plasma chemical vapor deposition apparatus which includes a process chamber and a plasma chamber, comprising the steps of:

positioning the substrate within said process chamber;

introducing into said plasma chamber an inert gas and oxygen gas, said inert gas being selected from at least one of the inert gases of the group consisting of argon, neon, krypton and xenon;

introducing r.f. power into said plasma chamber such that a plasma is created in the plasma chamber, said plasma containing an ion density of greater than $10^{11}$ ions/cm$^3$ and wherein the stability of the plasma is enhanced by introduction of said inert gas;

maintaining said substrate at a temperature of not more than 450° C.;

maintaining said process and plasma chambers at a pressure of not more than 20 mTorr;

introducing a silane gas into said process chamber adjacent the surface of said substrate; and introducing into one of said chambers a fluorine-containing gas, whereby said fluorocarbon gas is available at the surface of said substrate, and said silane gas and said fluorine-containing gas are excited by said plasma and interact proximate to the surface of said substrate to form a fluorinated silicon oxide layer on the surface of said substrate.

11. The method of claim 10 wherein the flow rate of said oxygen gas is approximately twice the flow rate of each of said silicon and fluorine-containing gases.

12. The method of claim 10 further comprising the step of simultaneously applying an r.f. bias to said substrate during the formation of said fluorinated silicon oxide layer such that the surface of said substrate is sputtered by ions of said inert gas etched by and ions of said fluorine-containing gas to enhance the filling of gaps on the surface of said substrate.

13. The method of claim 10 wherein said fluorine-containing gas is tetrafluoromethane ($CF_4$).

14. The method of claim 10 wherein said fluorine-containing gas is a fluorocarbon represented by the general formula $C_nF_{2+2n}$, wherein n is an integer of 1 to 3.

15. The method of claim 10 wherein said fluorine-containing gas is silicon tetrafluorine ($SiF_4$).

16. A method of forming a fluorinated silicon oxide layer on the surface of a substrate using a plasma chemical vapor deposition apparatus which includes a process chamber and a plasma chamber, comprising the steps of:

positioning the substrate within said process chamber;

introducing into said plasma chamber an inert gas and oxygen gas;

introducing r.f. power into said plasma chamber such that a plasma is created in the plasma chamber, said plasma containing an ion density of greater than $10^{11}$ ions/cm$^3$ and wherein the stability of the plasma is enhanced by introduction of said inert gas;

maintaining said substrate at a temperature of not more than 450° C.; maintaining said process and plasma chambers at a pressure of not more than 20 Mtorr;

introducing a silane gas into said process chamber adjacent the surface of said substrate; and introducing silicon tetrafluorine gas into one of said chambers, whereby said silicon tetrafluorine gas is available at the surface of said substrate and said silane gas and said silicon tetrafluorine gas are excited by said plasma and interact proximate to the surface of said substrate to form a fluorinated silicon oxide layer on the surface of said substrate.

17. The method of claim 16 further comprising the step of simultaneously applying an r.f. bias to said substrate during the formation of said fluorinated silicon oxide layer such that the surface of said substrate is sputtered by ions of said inert gas and ions of said fluorine-containing gas to enhance the filling of gaps on the surface of said substrate.

18. A method of forming a fluorinated silicon oxide dielectric layer on the surface of a substrate using a plasma chemical vapor deposition apparatus which includes a process chamber and a plasma chamber, comprising the steps of:

positioning the substrate within said process chamber;

introducing into said plasma chamber argon and oxygen gas, said inert gas being selected from at least one of the inert gases of the group consisting of argon, neon, krypton and xenon;

introducing r.f. power into said plasma chamber such that a plasma is created in the plasma chamber, said plasma containing an ion density of greater than $10^{11}$ ions/cm$^3$ and wherein the stability of the plasma is enhanced by introduction of said inert gas;

maintaining said substrate at a temperature of not more than 450° C.;

maintaining said process and plasma chambers at a pressure of not more than 20 Mtorr;

introducing a silane gas into said process chamber adjacent the surface of said substrate; and introducing tetrafluoromethane gas into one of said chambers, whereby said tetrafluoromethane gas is available at the surface of said substrate, and said silane gas and said tetrafluoromethane gas are excited by said plasma and interact proximate to the surface of said substrate to form a fluorinated silicon oxide layer on the surface of said substrate.

19. The method of claim 18 further comprising the step of simultaneously applying an r.f. bias to said substrate during the formation of said fluorinated silicon oxide layer such that the surface of said substrate is sputtered by ions of said argon gas and etched by ions of said fluorine-containing gas to enhance the filling of gaps on the surface of said substrate.

* * * * *